US009369236B2

(12) United States Patent
Kwon et al.

(10) Patent No.: US 9,369,236 B2
(45) Date of Patent: Jun. 14, 2016

(54) DECODING APPARATUS AND METHOD

(71) Applicant: Samsung Electronics Co., Ltd., Gyeonggi-do (KR)

(72) Inventors: Pilsung Kwon, Seoul (KR); Seunghyun Kwak, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 79 days.

(21) Appl. No.: 14/254,832

(22) Filed: Apr. 16, 2014

(65) Prior Publication Data

US 2014/0310578 A1    Oct. 16, 2014

(30) Foreign Application Priority Data

Apr. 16, 2013    (KR) .................. 10-2013-0041679

(51) Int. Cl.
*H03M 13/27*    (2006.01)
*H04L 1/00*    (2006.01)
*H03M 13/29*    (2006.01)
*H03M 13/00*    (2006.01)

(52) U.S. Cl.
CPC .......... *H04L 1/005* (2013.01); *H03M 13/2987* (2013.01); *H03M 13/6525* (2013.01); *H03M 13/6561* (2013.01)

(58) Field of Classification Search
CPC .............. H04L 1/005; H03M 13/6561; H03M 13/6525; H03M 13/2987; H03M 13/2771
See application file for complete search history.

(56) References Cited

U.S. PATENT DOCUMENTS

| | | | |
|---|---|---|---|
| 6,421,696 B1* | 7/2002 | Horton | G06F 17/142 708/404 |
| 2013/0101015 A1* | 4/2013 | He | H04N 21/234327 375/240.02 |
| 2014/0269627 A1* | 9/2014 | Gorokhov | H04L 1/004 370/336 |

* cited by examiner

*Primary Examiner* — Albert Decady
*Assistant Examiner* — Kyle Vallecillo

(57) ABSTRACT

The present disclosure relates to a turbo decoder and decoding method thereof. The turbo decoder has a plurality of decoder cores. The decoding method includes: computing remaining decoding times for the multiple decoder cores; selecting a decoder core with the shortest remaining decoding time among the multiple decoder cores; and allocating a packet to the selected decoder core. The decoder cores of the turbo decoder are monitored in real time and resources are distributed through efficient decoder core selection enhancing decoding throughput.

14 Claims, 5 Drawing Sheets

DECODING APPARATUS AND METHOD

CROSS-REFERENCE TO RELATED APPLICATION(S) AND CLAIM OF PRIORITY

The present application is related to and claims the benefit under 35 U.S.C. §119(a) of a Korean patent application filed in the Korean Intellectual Property Office on Apr. 16, 2013 assigned Serial No. P2013-0041679, the entire disclosure of which is incorporated herein by reference.

TECHNICAL FIELD

The present disclosure relates to a turbo decoder and decoding method thereof. More particularly, the present disclosure relates to a decoding apparatus and method enabling efficient selection of turbo decoder cores.

BACKGROUND

Turbo coding is used as a channel coding scheme for high-speed data transmission in mobile communication systems, such as a third generation Wideband Code Division Multiple Access (WCDMA) system and fourth generation Long-Term Evolution (LTE) or Worldwide Interoperability for Microwave Access (WiMax) 16 m systems.

Turbo coding is regarded as an important enhancement to Forward Error Correction (FEC). Although there are various types of turbo coding, representative types thereof use multiple encoding stages separated by interleaving steps in combination with iterative decoding. Such a combination of multiple encoding stages and iterative decoding provides communication systems with a higher noise limit in comparison to other existing FEC schemes. That is, turbo coding enables reliable communication with lower energy per bit relative to the noise power spectral density in comparison to other existing FEC schemes.

FIG. 1 is a block diagram of a turbo decoder. A turbo decoder core 100, which is commonly used for traffic processing in a modern mobile communication system based on WCDMA, LTE or WiMax 16 m, is basically composed of two or more component decoders.

In the example shown in FIG. 1, a decoding process of the turbo decoder core 100, one component decoder takes channel inputs and log-likelihood ratio (LLR) values produced by the other component decoder as input and produces new LLR values as output. The new LLR values can be used by the other component decoder as additional LLR values together with a received input signal to thereby produce more accurate LLR values.

More specifically, LLR soft inputs are interleaved through the first interleaver 130 and are fed to the first component decoder 110, and the output from the first component decoder 110 is de-interleaved through the de-interleaver 140. The de-interleaved signal is fed to the second component decoder 120 and is decoded. The decoded signal is interleaved through the second interleaver 150 and is fed back to the first component decoder 110. That is, the signal is processed through an iterative structure, wherein the output of the first component decoder 110 is fed to the second component decoder 120 and the output of the second component decoder 120 is fed back to the first component decoder 110.

The turbo decoder core 100 can produce highly accurate LLR values through iterative decoding. The turbo decoder core 100 performs iterative decoding until a given number of iterations is reached and then makes a hard decision on final soft outputs to produce the decoded values. In a turbo decoder core 100 having two or more component decoders, the component decoders exchange LLR values with each other during iterative decoding and produce more accurate LLR values with increasing number of iterations, gradually enhancing error correction capabilities.

Meanwhile, the throughput obtainable by using only one decoder core may be insufficient for high performance. Hence, a high-speed data system such as the LTE system may use a multi-core decoder having multiple decoder cores.

FIG. 2 is a block diagram of a multi-core turbo decoder. The multi-core decoder 200 includes two or more decoder cores 220, 230, 240 and 250. LLR data of the LLR memory 280, as an FEC block, is fed through Hybrid-ARQ (HARQ) combining 290 to the multi-core decoder 200. The controller 210 of the decoder 200 feeds LLR data to idle decoder cores 220, 230, 240 and 250 in sequence. That is, initially, LLR data is sequentially input to the decoder cores 220, 230, 240 and 250. Thereafter, when all the decoder cores 220, 230, 240 and 250 are involved in decoding LLR data, the controller 210 selects one decoder core that has completed decoding of assigned LLR data and feds the next FEC packet to the selected decoder core.

In the turbo decoder 200 having an existing multi-core configuration, LLR data as an FEC block is assigned to one decoder core selected in sequence without consideration of processing conditions. As such, when the FEC block size varies widely, a particular decoder core may be heavily loaded unless input FEC blocks are rearranged according to their sizes. This may increase the decoding time and reduce decoding throughput.

In addition, decoding throughput reduction can increase differences between output times of related FEC blocks during multi-user information processing. This may require an increase in the size of the output memory 270 for FEC block rearrangement, increasing hardware complexity.

SUMMARY

To address the above-discussed deficiencies, it is a primary object to provide an apparatus and method that can increase decoding throughput of a receiver through efficient selection of turbo decoder cores so as to achieve high-speed data transmission in a mobile communication system.

Another aspect of the present disclosure is to provide an apparatus and method that can increase decoding throughput even under resource constraints through effective selection of decoder cores.

Other aspects related to the subject matter of the present disclosure will be more apparent to those skilled in the art from the following description.

In accordance with an aspect of the present disclosure, a decoding method for a decoder having multiple decoder cores is provided. The decoding method includes: computing remaining decoding times for the multiple decoder cores; selecting a decoder core with the shortest remaining decoding time among the multiple decoder cores; and allocating a packet to the selected decoder core.

The computing of the remaining decoding times for the decoder cores includes computing, for each decoder core, the remaining decoding time for a first packet that is currently decoded and stored in a first buffer of the decoder core.

The computing of the remaining decoding times further includes computing, for each decoder core, the remaining decoding time for a second packet that is to be decoded next and stored in a second buffer of the decoder core, and calculating the sum of the remaining decoding time for the first packet and the remaining decoding time for the second packet.

The computing of the remaining decoding time for the first packet includes calculating the product of the size of the first packet and the remaining number of decoding iterations obtained by subtracting the number of decoding iterations performed from the preset number of decoding iterations for the first packet.

The computing of the remaining decoding time for the second packet includes calculating the product of the size of the second packet and the preset number of decoding iterations for the second packet.

The computing of the remaining decoding time for the second packet includes: checking whether a second packet to be decoded next is stored in the second buffer; and calculating, when a second packet to be decoded next is stored in the second buffer, the remaining decoding time for the second packet.

The computing of the remaining decoding time for the second packet further includes setting, when a second packet to be decoded next is not stored in the second buffer, the remaining decoding time for the second packet to zero.

In accordance with another aspect of the present disclosure, a decoder is provided. The decoder includes: a plurality of decoder cores to decode received packets; an arithmetic logic unit (ALU) configured to compute remaining decoding times for the individual decoder cores and to select a decoder core with the shortest remaining decoding time among the decoder cores; and a controller configured to allocate a packet to the selected decoder core.

In a feature of the present disclosure, a turbo decoder and decoding method therefor are provided. The decoding method enables the turbo decoder to monitor decoder cores in real time and to effectively distribute resources through efficient decoder core selection, increasing decoding throughput. In addition, it is possible to increase decoding throughput even under resource constraints through effective selection of decoder cores.

Other features and advantages of the present disclosure will be more apparent to those skilled in the art from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 3:
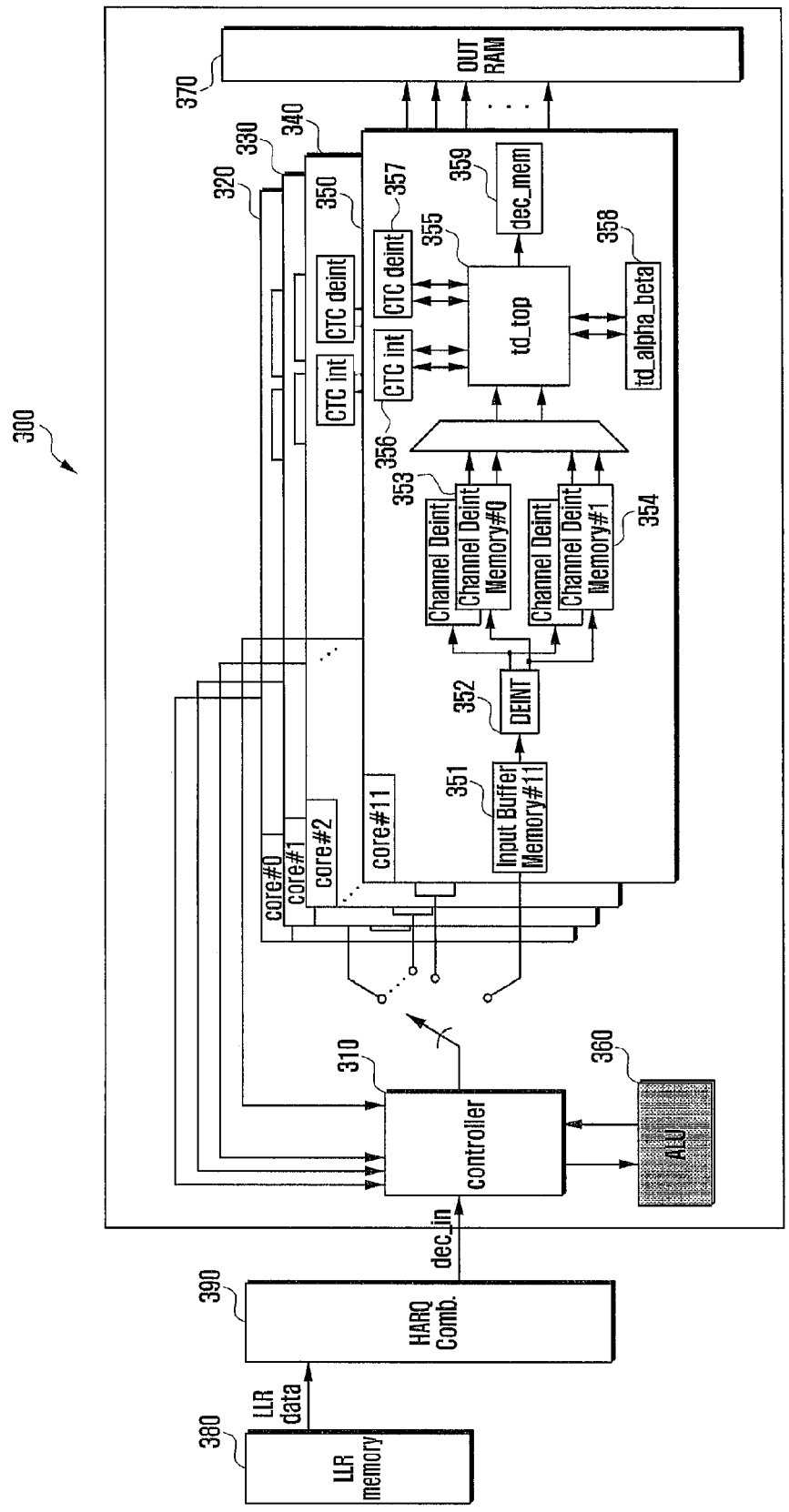
FIG. 3 illustrates a block diagram of a multi-core turbo decoder according to an embodiment of the present disclosure.
Figure 4:
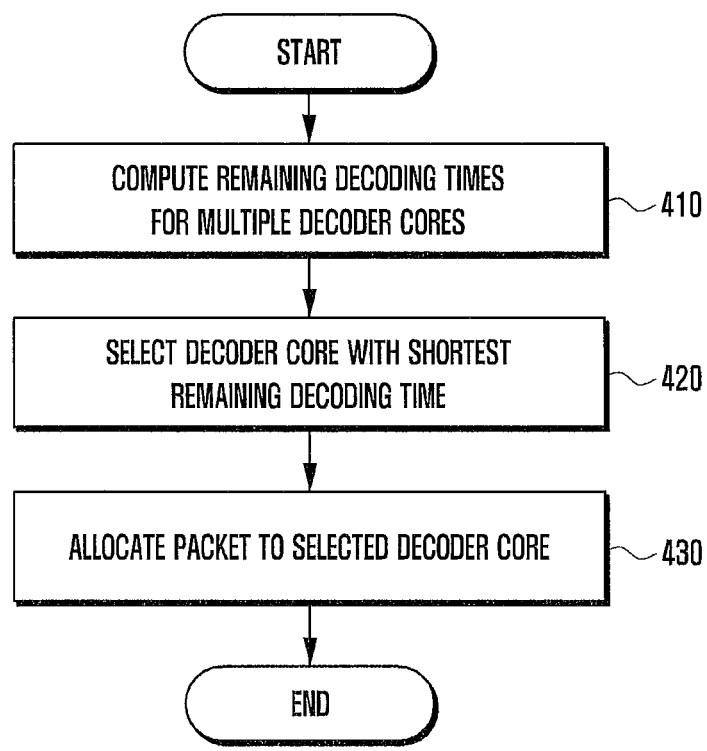
FIG. 4 illustrates a high-level flowchart of a decoding method for a multi-core turbo decoder according to an embodiment of the present disclosure.
Figure 5:
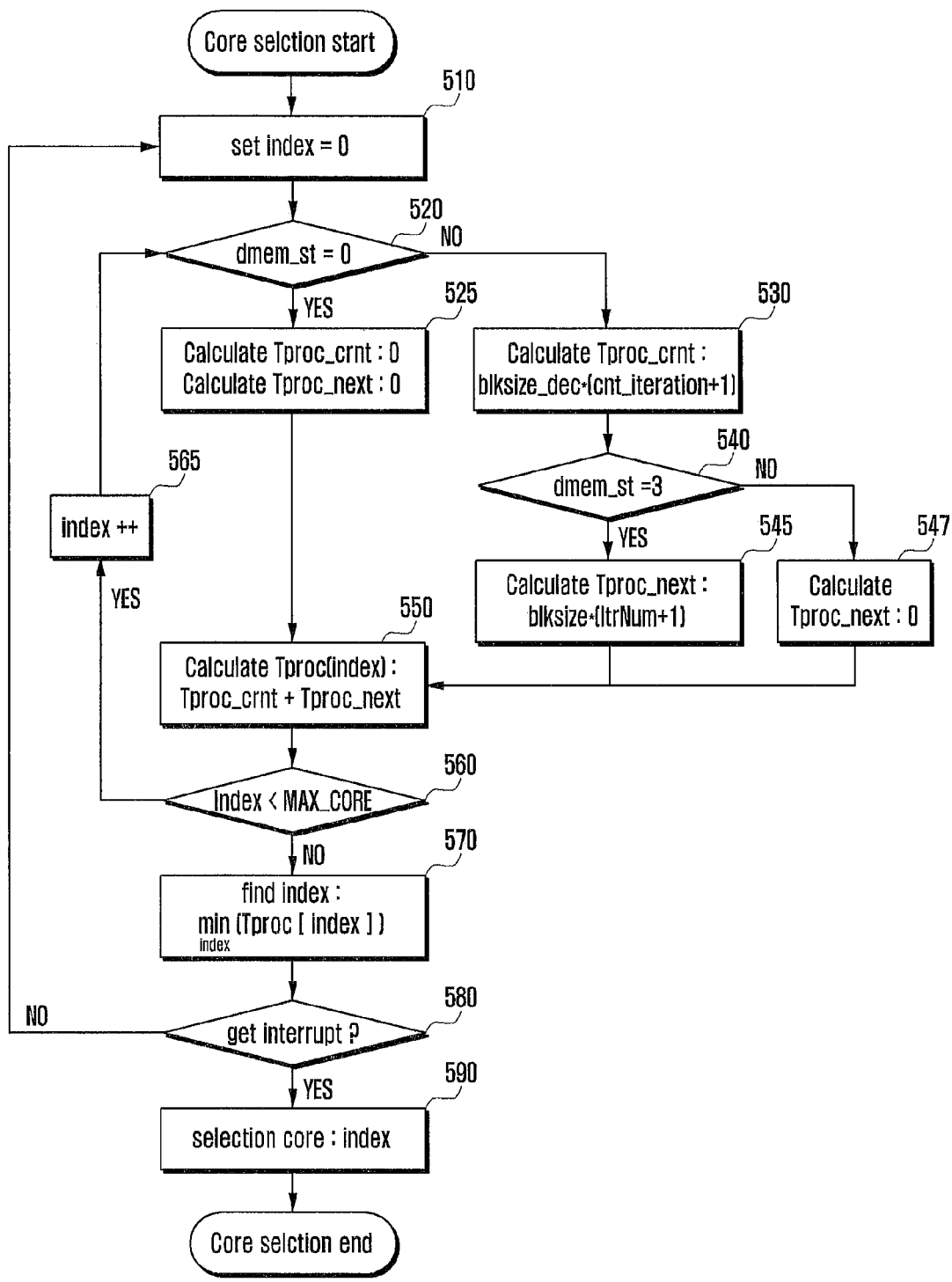
FIG. 5 illustrates a flowchart of a procedure for selecting a decoder core with the shortest remaining decoding time in a multi-core turbo decoder according to an embodiment of the present disclosure.

FIGS. 3 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system. Hereinafter, embodiments of the present disclosure are described in detail with reference to the accompanying drawings. Detailed descriptions of well-known functions and structures incorporated herein may be omitted to avoid obscuring the subject matter of the present disclosure. The terms and words used in the following description and claims are defined to describe the present disclosure and should be construed in accordance with the spirit of the present disclosure.

FIG. 3 illustrates a block diagram of a multi-core turbo decoder 300 according to an embodiment of the present disclosure. The multi-core turbo decoder 300 includes two or more decoder cores 320, 330, 340 and 350. Unlike the multi-core turbo decoder 200 shown in FIG. 2, the multi-core turbo decoder 300 further includes an Arithmetic Logic Unit (ALU) 360. The ALU 360 computes remaining decoding times of the individual decoder cores 320 to 350 in real time. By use of the remaining decoding times computed by the ALU 360, the controller 310 can select a decoder core 320, 330, 340 or 350 with the shortest remaining decoding time and allocate a next packet to be processed to the selected decoder core. Such a load balancing function can enhance resource distribution efficiency and increase throughput of the multi-core turbo decoder 300.

Figure 1:
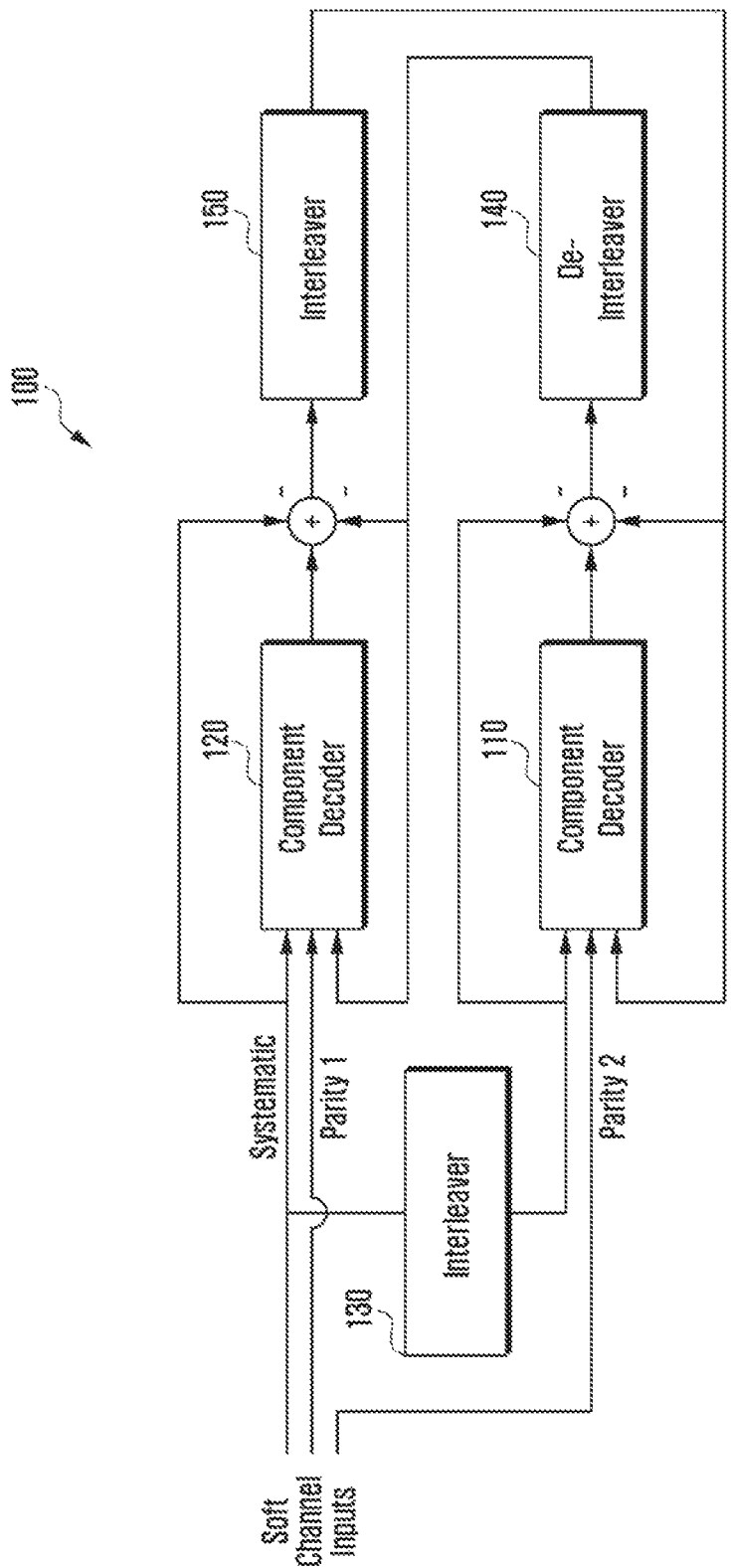
FIG. 1 illustrates a block diagram of a turbo decoder.
Figure 2:
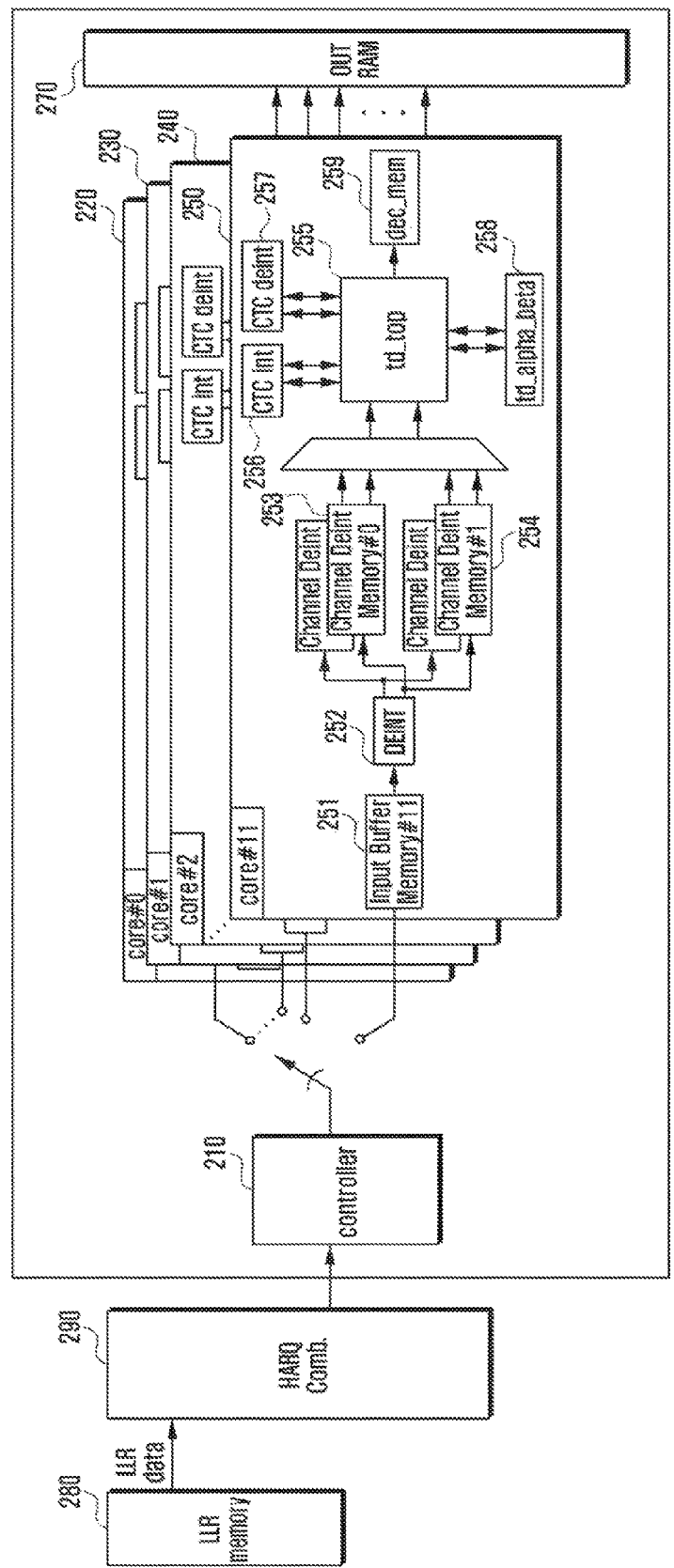
FIG. 2 illustrates a block diagram of a multi-core turbo decoder.

In the case of the multi-core turbo decoder 200 that does not include an ALU, as shown in FIG. 2, the controller 210 allocates input signals of the decoder 200 to the decoder cores 210 to 250 in units of, for example, FEC packets. For instance, the controller 210 initially allocates packets to the decoder cores 210 to 250 in sequence. Thereafter, the controller 210 selects a decoder core having completed decoding first. In this case, the next FEC packet is assigned to one decoder core selected in sequence without consideration of processing conditions. Hence, when the size of input packets varies, processing load can be concentrated on a particular decoder core.

Referring back to FIG. 3, LLR data in units of FEC blocks can be fed to the multi-core turbo decoder 300. As shown, LLR data of the LLR memory 380 can be input via Hybrid-ARQ (HARQ) combining 390. LLR data can be input in other ways. The controller 310 can receive information on the remaining decoding times of the decoder cores in real-time from the ALU 360. The controller 310 can select one of the decoder cores with the shortest remaining decoding time and assign a next packet to the selected decoder core.

For example, the multi-core turbo decoder 300 can include first to n-th decoder cores 320, 330, 340 and 350. Although 12 decoder cores are shown in FIG. 3, a different number of decoder cores can be included without departing from the scope of the present disclosure. The ALU 360 can utilize information received from each of the first to n-th decoder cores 320, 330, 340 and 350 to compute the remaining decoding time for a packet assigned to the decoder core in real time.

Each of the first to n-th decoder cores 320, 330, 340 and 350 can provide the ALU 360 with information regarding the size of a packet assigned thereto, the preset number of decoding iterations, and the number of decoding iterations performed so far. The size of packets assigned and the preset number of decoding iterations can differ from decoder core to decoder core. Each of the first to n-th decoder cores 320, 330, 340 and 350 can receive information regarding the preset number of decoding iterations from the controller 310.

For each of the first to n-th decoder cores 320, 330, 340 and 350, the ALU 360 can compute the remaining decoding time on the basis of the size of a packet assigned to the decoder core or the product of the size of an assigned packet and the preset number of decoding iterations.

In various embodiments, one decoder core can include two or more buffers 353 and 354. In this case, the first buffer 353 can store the packet currently being decoded (first packet), and the second buffer 354 can store a packet to be decoded next (second packet). Alternatively, only one of the first buffer 353 and the second buffer 354 can store a packet. After the first packet in the first buffer 353 is decoded, the second packet in the second buffer 354 can be decoded. Then, while the second packet is being decoded, a third packet to be decoded next can be stored in the first buffer 353.

In the event that the second buffer 354 is empty and only the first buffer 353 stores the first packet currently being decoded, the remaining decoding time of the decoder core can be obtained by computing the remaining decoding time of the first packet. For example, the remaining decoding time of the decoder core can be determined by computing the product of the size of the first packet (S1) and the difference (M1−M2) obtained by subtracting the number of decoding iterations performed so far (M2) from the preset number of decoding iterations (M1).

When the first packet is stored in the first buffer 353 and the second packet is stored in the second buffer 354, the remaining decoding time of the decoder core can be obtained by computing the remaining decoding times of the first packet and the second packet. For example, the remaining decoding time of the first packet currently being decoded can be determined by computing the product of the size of the first packet (S1) and the difference (M1−M2) obtained by subtracting the number of decoding iterations performed so far (M2) from the preset number of decoding iterations (M1). The remaining decoding time of the second packet can be determined by computing the product of the size of the second packet (S2) and the preset number of decoding iterations (M3). The ALU 360 can compute the remaining decoding time for the decoder core by adding the remaining decoding time of the first packet to the remaining decoding time of the second packet.

To compute the remaining decoding time for a decoder core, the ALU 360 checks whether a second packet to be decoded is stored in the second buffer 354. If a second packet to be decoded is stored in the second buffer 354, the ALU 360 computes the remaining decoding time of the second packet.

If a second packet to be decoded is not stored in the second buffer 354, the ALU 360 sets the remaining decoding time of the second packet to zero.

In computation of the remaining decoding times for the multiple decoder cores, the ALU 360 can repeatedly compute the remaining decoding times for the decoder cores until a signal indicating completion of decoding one packet is received from one of the decoder cores. Here, the ALU 360 can receive decoding related information described before in real time from each decoder core.

The ALU 360 can also compute the remaining decoding times for the decoder cores whenever the controller 310 allocates a new packet to be decoded to one of the decoder cores. That is, when a new packet is allocated, the ALU 360 computes the remaining decoding times of the decoder cores, and selects a decoder core with the shortest remaining decoding time and stores the selection information. The ALU 360 can skip computation of the remaining decoding times while decoding is performed by the decoder cores. Thereafter, when a signal indicating packet decoding completion is received from one of the decoder cores, the controller 310 can allocate a new packet to be decoded to the selected decoder core and then the ALU 360 can re-compute the remaining decoding times for the decoder cores. Here, the ALU 360 can receive decoding related information from the multiple decoder cores and compute the remaining decoding times for the decoder cores. Alternatively, the ALU 360 can receive decoding related information only from one decoder core to which a new packet is allocated and compute the remaining decoding time for the decoder core. Here, for the remaining decoder cores, the ALU 360 can skip reception of decoding related information and compute the remaining decoding times according to the internal clock of the decoder 300.

In one embodiment, the turbo decoder can be a convolutional turbo code (CTC) decoder. In regular turbo coding, one bit is input and encoded per clock cycle. Alternatively, in convolutional turbo coding, two bits are input and encoded per clock cycle. Use of a CTC decoder can increase processing speed.

As described above, the remaining decoding times of the turbo decoder cores are computed, and a new packet to be decoded is assigned to the turbo decoder core with the shortest remaining decoding time. Hence, resource distribution along with effective decoder core selection can enhance decoding throughput.

Meanwhile, in the multi-core turbo decoder 200 or 300 including multiple decoder cores, packets decoded by the decoder cores are stored in the output memory 270 or 370 and are aggregated into a burst unit. Here, in the case of the decoder 200 shown in FIG. 2, reduction of decoding throughput can increase differences between output times of related FEC packets during multi-user information processing. This can require an increase in the size of the output memory 270 for FEC packet rearrangement, increasing hardware complexity. However, in the case of the multi-core decoder 300 including the ALU 360, enhancement of decoding throughput can obviate the need to increase the size of the output memory 370 used to handle decoded packets, reducing hardware complexity.

Hereinabove, a description is given of a configuration and operation of the decoder according to an embodiment of the present disclosure. Next, a description is given of a decoding method according to an embodiment of the present disclosure.

FIG. 4 illustrates a high-level flowchart illustrating a decoding method for the multi-core turbo decoder according to an embodiment of the present disclosure.

Referring to FIG. 4, at operation 410, the arithmetic logic unit (ALU) computes the remaining decoding times for the individual decoder cores.

Specifically, the ALU 360 can utilize information received from each of the decoder cores 320, 330, 340 and 350 to compute the remaining decoding time for a packet assigned to the decoder core in real time. Each of the decoder cores 320 to 350 can provide the ALU 360 with information regarding the size of a packet assigned thereto, the preset number of decoding iterations, and the number of decoding iterations performed so far. The size of packets assigned and the preset number of decoding iterations can differ from decoder core to decoder core. Each of the decoder cores 320, 330, 340 and 350 can receive information on the preset number of decoding iterations from the controller 310. Computation of the remaining decoding times is described in connection with FIG. 3, and hence a description thereof is omitted.

At operation 420, the ALU 360 selects a decoder core with the shortest remaining decoding time among the decoder cores whose remaining decoding times are computed at operation 410. That is, the ALU 360 can select a decoder core that is expected to complete decoding earliest.

At operation 430, the ALU 360 notifies the controller 310 of the decoder core selected at operation 420, and the controller 310 allocates a new packet to the selected decoder core.

Next, a description is given of computation of remaining decoding times for decoder cores and selection of a decoder core with the shortest remaining decoding time with reference to FIG. 5.

FIG. 5 is a flowchart of a procedure for selecting a decoder core with the shortest remaining decoding time in the multicore turbo decoder according to an embodiment of the present disclosure.

Referring to FIG. 5, at operation 510, the ALU 360 initializes an index for decoder cores to zero.

At operation 520, the ALU 360 examines the buffer state (dmem_st) of the decoder core indicated by the index. Here, it is assumed that each decoder core includes first and second buffers. The buffer state (dmem_st) indicates whether a packet is stored in the first or second buffer. When dmem_st is zero (dmem_st=0), this indicates that no packet is stored in the first buffer or the second buffer. When dmem_st is one or two (dmem_st=1 or dmem_st=2), this indicates that a packet is stored in one of the first buffer and second buffer. When dmem_st is three (dmem_st=3), this indicates that packets are stored in both the first buffer and the second buffer.

Upon determining that the buffer state (dmem_st) is zero, since there is no need to compute the remaining decoding times as the buffers are empty, the ALU 360 proceeds to operation 525 at which the ALU 360 sets the remaining decoding time for a packet currently being decoded (Tproc_crnt) to zero and sets the remaining decoding time for a packet to be decoded next (Tproc_next) to zero.

Upon determining that the buffer state (dmem_st) is not zero, the ALU 360 proceeds to operation 530 at which the ALU 360 computes the remaining decoding time for the packet currently being decoded (Tproc_crnt). That is, as the buffer state (dmem_st) being non-zero means that a packet being decoded is stored in the first buffer of the decoder core under consideration, the ALU 360 can compute the remaining decoding time for the packet currently being decoded (Tproc_crnt).

Specifically, the remaining decoding time for a first packet currently being decoded (Tproc_crnt) can be determined by computing the product of the size of the first packet (blksize_dec) and the remaining number of decoding iterations (cnt_iteration) obtained by subtracting the number of decoding iterations performed from the preset number of decoding iterations. For example, as shown, the remaining decoding time for the first packet currently being decoded (Tproc_crnt) can be set to a value obtained by multiplying the size of the first packet being decoded (blksize_dec) and the remaining number of decoding iterations plus one (cnt_iteration+1). When a parallel decoder is utilized, the packet size (blksize_dec) can be divided by the number of parallel decoder cores.

At operation 540, the ALU 360 determines whether the buffer state indicates that a second packet to be decoded next is stored in the second buffer (dmem_st=3).

Upon determining that a second packet to be decoded next is stored in the second buffer (dmem_st=3), the ALU 360 proceeds to operation 545 at which the ALU 360 computes the remaining decoding time for the second packet to be decoded next (Tproc_next). Specifically, the remaining decoding time for a second packet to be decoded next (Tproc_next) can be determined by computing the product of the size of the second packet (blksize) and the preset number of decoding iterations (ItrNum). For example, as shown, the remaining decoding time for the second packet to be decoded next (Tproc_next) can be set to a value obtained by multiplying the size of the second packet (blksize) and the preset number of decoding iterations plus one (ItrNum+1).

Upon determining that a second packet to be decoded next is not stored in the second buffer (dmem_st≠3), the ALU 360 proceeds to operation 547 at which the ALU 360 sets the remaining decoding time for the packet to be decoded next (Tproc_next) to zero.

At operation 550, the ALU 360 computes the remaining decoding time for the decoder core (Tproc[index]) on the basis of the remaining decoding time for the packet currently being decoded (Tproc_crnt) and the remaining decoding time for the packet currently being decoded (Tproc_crnt) and the remaining decoding time for the packet to be decoded next (Tproc_next) computed at operations 525, 530, 545 and 547. For example, the remaining decoding time for the decoder core (Tproc[index]) can be set to the sum of the remaining decoding time for the packet currently being decoded (Tproc_crnt) and the remaining decoding time for the packet to be decoded next (Tproc_next).

Thereafter, at operation 560, the ALU 360 determines whether the remaining decoding times for all the decoder cores have been computed. That is, the ALU 360 checks whether the index is greater than or equal to the number of decoder cores (MAX_CORE). If the index is less than the number of decoder cores (MAX_CORE), the ALU 360 proceeds to operation 565 at which the ALU 360 increases the index by one (index++) and returns to operation 520 for processing of the next decoder core.

If the index is greater than or equal to the number of decoder cores (MAX_CORE) (all the decoder cores of the decoder 300 have been processed), the ALU 360 proceeds to operation 570 at which the ALU 360 finds the index value of a decoder core with the shortest remaining decoding time. That is, the ALU 360 selects a decoder core with the shortest remaining decoding time among the decoder cores.

Here, selection of a decoder core with the shortest remaining decoding time can be made by the controller 310 rather than the ALU 360. That is, the ALU 360 can provide the controller 310 with information on the remaining decoding times of the decoder cores, and the controller 310 can select a decoder core with the shortest remaining decoding time on the basis of the provided information.

At operation 580, the ALU 360 determines whether a signal indicating packet decoding completion is received from one of the decoder cores. This determination can also be performed by the controller 310.

Upon determining that a signal indicating packet decoding completion is not received at operation 580, the ALU 360 returns to operation 510 and can repeat computation of the remaining decoding times for the decoder cores. Alternatively, the ALU 360 can return to operation 510 only after the controller 310 allocates a new packet to the decoder core selected at operation 570.

Upon determining that a signal indicating packet decoding completion is received at operation 580, the controller 310 proceeds to operation 590 at which the controller 310 allocates a new packet to the decoder core selected at operation 570 and ends the decoder core selection procedure.

Hereinabove, embodiments of the present disclosure have been described with reference to the accompanying drawings. Specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents. Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A decoding method for a decoder having a plurality of decoder cores, the method comprising:
   identifying infoimation regarding at least one of a size of a packet assigned, a preset number of decoding iterations, and a number of the decoding iterations performed;
   computing remaining decoding times for the plurality of decoder cores based on the information;
   determining a decoder core with the shortest remaining decoding time among the plurality of decoder cores; and
   allocating a packet to the deteimined decoder core.

2. The decoding method of claim 1, wherein the computing of the remaining decoding times comprises computing, for each decoder core, the remaining decoding time for a first packet that is currently decoded and stored in a first buffer of the decoder core.

3. The decoding method of claim 2, wherein the computing of the remaining decoding times further comprises computing, for each decoder core, the remaining decoding time for a second packet that is to be decoded next and stored in a second buffer of the decoder core, and calculating the sum of the remaining decoding time for the first packet and the remaining decoding time for the second packet.

4. The decoding method of claim 2, wherein the computing of the remaining decoding time for the first packet comprises calculating the product of the size of the first packet and the remaining number of decoding iterations obtained by subtracting the number of decoding iterations performed from the preset number of decoding iterations for the first packet.

5. The decoding method of claim 3, wherein the computing of the remaining decoding time for the second packet comprises calculating the product of the size of the second packet and the preset number of decoding iterations for the second packet.

6. The decoding method of claim 3, wherein the computing of the remaining decoding time for the second packet comprises:
   checking whether a second packet to be decoded next is stored in the second buffer; and
   calculating, when a second packet to be decoded next is stored in the second buffer, the remaining decoding time for the second packet.

7. The decoding method of claim 6, wherein the computing of the remaining decoding time for the second packet further comprises setting, when a second packet to be decoded next is not stored in the second buffer, the remaining decoding time for the second packet to zero.

8. A decoder comprising:
   a plurality of decoder cores configured to decode received packets;
   an arithmetic logic unit (ALU) configured to compute remaining decoding times for the individual decoder cores based on information identified from the plurality of decoder cores and to determine a decoder core with the shortest remaining decoding time among the decoder cores; and
   a controller configured to allocate a packet to the determined decoder core,
   wherein the information includes at least one of a size of a packet assigned, a preset number of decoding iterations, and a number of decoding iterations performed.

9. The decoder of claim 8, wherein the ALU computes, for each decoder core, the remaining decoding time for a first packet that is currently decoded and stored in a first buffer of the decoder core.

10. The decoder of claim 9, wherein the ALU is configured to compute, for each decoder core, the remaining decoding time for a second packet that is to be decoded next and stored in a second buffer of the decoder core, and compute the remaining decoding time for the decoder core by calculating the sum of the remaining decoding time for the first packet and the remaining decoding time for the second packet.

11. The decoder of claim 9, wherein the ALU is configured to compute the remaining decoding time for the first packet by use of the product of the size of the first packet and the remaining number of decoding iterations obtained by subtracting the number of decoding iterations performed from the preset number of decoding iterations for the first packet.

12. The decoder of claim 10, wherein the ALU is configured to compute the remaining decoding time for the second packet by use of the product of the size of the second packet and the preset number of decoding iterations for the second packet.

13. The decoder of claim 10, wherein the ALU is configured to check whether a second packet to be decoded next is stored in the second buffer, and calculate, when a second packet to be decoded next is stored in the second buffer, the remaining decoding time for the second packet.

14. The decoder of claim 13, wherein the ALU is configured to set, when a second packet to be decoded next is not stored in the second buffer, the remaining decoding time for the second packet to zero.

* * * * *